United States Patent [19]

Halvorson

[11] Patent Number: 4,532,513
[45] Date of Patent: Jul. 30, 1985

[54] AIRCRAFT NAVIGATION COMPUTER DISPLAY

[75] Inventor: Sheldon J. Halvorson, Prescott Valley, Ariz.

[73] Assignee: Global Navigation, Inc., Irvine, Calif.

[21] Appl. No.: 296,699

[22] Filed: Aug. 27, 1981

[51] Int. Cl.³ .................. G01C 21/00; H05K 1/14; H04N 5/72; H04N 5/64
[52] U.S. Cl. .................. 340/971; 361/395; 361/424; 358/254; 358/252; 358/253; 312/7.2
[58] Field of Search ............ 340/700, 27 NA, 971; 358/254, 255, 252, 253; 364/442, 444; 361/412, 415, 395, 399, 424; 312/7.2; 315/1; 313/364

[56] References Cited

U.S. PATENT DOCUMENTS

| | | | |
|---|---|---|---|
| 2,436,847 | 3/1948 | Wolfson | 250/71 |
| 2,483,432 | 10/1949 | Richardson | 343/11 |
| 2,874,377 | 2/1959 | Lawlor | 340/369 |
| 3,511,560 | 10/1962 | Hamilton | 350/276 |
| 3,638,060 | 1/1972 | Wacher | 313/112 |
| 3,758,716 | 9/1973 | James et al. | 358/254 |
| 4,048,669 | 9/1977 | Bowler et al. | 358/254 |
| 4,086,632 | 4/1978 | Lions | 364/444 |
| 4,177,399 | 12/1979 | Muccigrosso et al. | 313/368 |
| 4,220,994 | 9/1980 | Hendrickson | 364/450 |
| 4,247,871 | 1/1981 | Hirsch | 358/253 |
| 4,306,253 | 12/1981 | Naramura | 358/254 |
| 4,312,041 | 1/1982 | De Jonge | 340/27 NA |
| 4,338,635 | 7/1982 | Haider et al. | 358/254 |
| 4,399,487 | 8/1983 | Neumann | 361/395 |

*Primary Examiner*—James J. Groody
*Attorney, Agent, or Firm*—Michael B. McMurry; Ted E. Killingsworth; Harold A. Williamson

[57] ABSTRACT

In order to provide an aircraft navigation computer display unit for use in an aircraft with limited cockpit panel space, the display unit is provided with a housing configured in a rectangular cross-section and includes a cathode ray tube assembly secured in an upper quadrant of the housing, a power supply secured directly below the CRT assembly and a group of circuit boards vertically orientated in the remaining half of the housing in tracks that permit the removal of the circuit boards from the front of the housing. The display unit also includes a front panel assembly having data entry and function switches enclosed therein and an opening aligned with the CRT. The front panel additionally includes a plastic filter secured to a shoulder of the front panel assembly in front of the CRT wherein the filter is located approximately 0.010 inch from the CRT when the front panel is secured to the housing.

14 Claims, 6 Drawing Figures

AIRCRAFT NAVIGATION COMPUTER DISPLAY

TECHNICAL FIELD

The invention relates to the field of aircraft navigation computer displays and in particular to aircraft navigation computer displays utilizing cathode ray tubes.

BACKGROUND OF THE INVENTION

In configuring the display unit for an aircraft navigational computer system such as a system that utilizes very low frequency radio signals in combination with the Omega system, the provision for maximizing the function and display area of the display unit must be balanced against the very limited availability of flight panel areas in the typical aircraft cockpit. Various human factor considerations are also very important with respect to the design of the display and the operation of the system. Such factors include the nature and location of the display as well as the type and location of the operator actuated data input and function means. It is also highly desirable to provide for ease of maintainability of the display unit especially in smaller aircraft such as those used in corporate flying.

In addition, to be fully effective, the controlled display unit must provide a readable display in all conditions including bright sunlight. In order to enhance viewability of the display, reflections should be eliminated from the viewing surface of the display.

Heretofore one approach used to provide a cathode ray tube type display with a high contrast ratio has been to use a phosphor that has a very narrow spectral emission band and then to bond a matching glass filter having a narrow band transmittance that matches the phosphor emission band directly to the face of the cathode ray display screen. Reflections are eliminated by depositing a reflection reducing coating to the viewing surface of the glass filter bonded to the CRT. This approach has proven to be quite costly both in terms of materials and in terms of manufacturing since close tolerances are required to bond the glass filter to the CRT and to apply the reflection reducing coating.

SUMMARY OF THE INVENTION

It is therefore an object of the invention to provide a navigation computer display assembly for aircraft that includes: a housing having a rectangular cross-section; a cathode ray tube assembly including a cathode ray tube assembly secured in an upper quadrant of the housing; a power supply secured within the housing below the cathode ray tube assembly; a group of circuit boards vertically orientated and secured within the housing such that they can slide out the front of the housing; a rear panel including a receptical for receiving the circuit boards secured within the housing; and a front panel assembly, including switches and an aperture for the CRT, attached to the housing such that the CRT aperture is aligned with the cathode ray tube.

It is an additional object of the invention to provide a navigational computer assembly for aircraft device that includes: a housing having a rectangular cross-section; a cathode ray tube assembly that includes a cathode ray tube having a display screen and a shield configured out of a high permeability metal enclosing the cathode ray tube and wherein the shield is secured to one side and the top of the housing; a power supply secured to the same side and the bottom of the housing; a number of pairs of tracks where one track of each pair is attached to the top of the housing and the other is attached to the bottom of the housing; circuit boards engaged with each pair of tracks; a rear panel attached to the housing that includes a receptical for receiving the circuit board electrical terminals; and a planar front panel assembly including switches and configured with a CRT aperture aligned with the cathode ray tube and further including a filter secured in close opposition to the cathode ray tube display screen along with a group of fasteners for securing the front panel to the housing.

It is a further object of the invention to provide a navigation computer display assembly for aircraft that includes a housing configured with a front panel mounting flange; a cathode ray tube assembly including a cathode ray tube having a display screen secured within the housing; and a generally planar front panel assembly including planar front and rear members configured with a CRT aperture and a shoulder portion around the aperture and further including a group of switches secured within the front panel assembly by the front and rear members and fastening devices for securing the front panel assembly to the housing flange. The display assembly also includes a plastic filter secured to the shoulder of the front panel assembly wherein the filter is located approximately 0.010 inch from the display screen and has a band transmittance of approximately 544 nm.

DETAILED DESCRIPTION OF THE INVENTION

Figure 1:
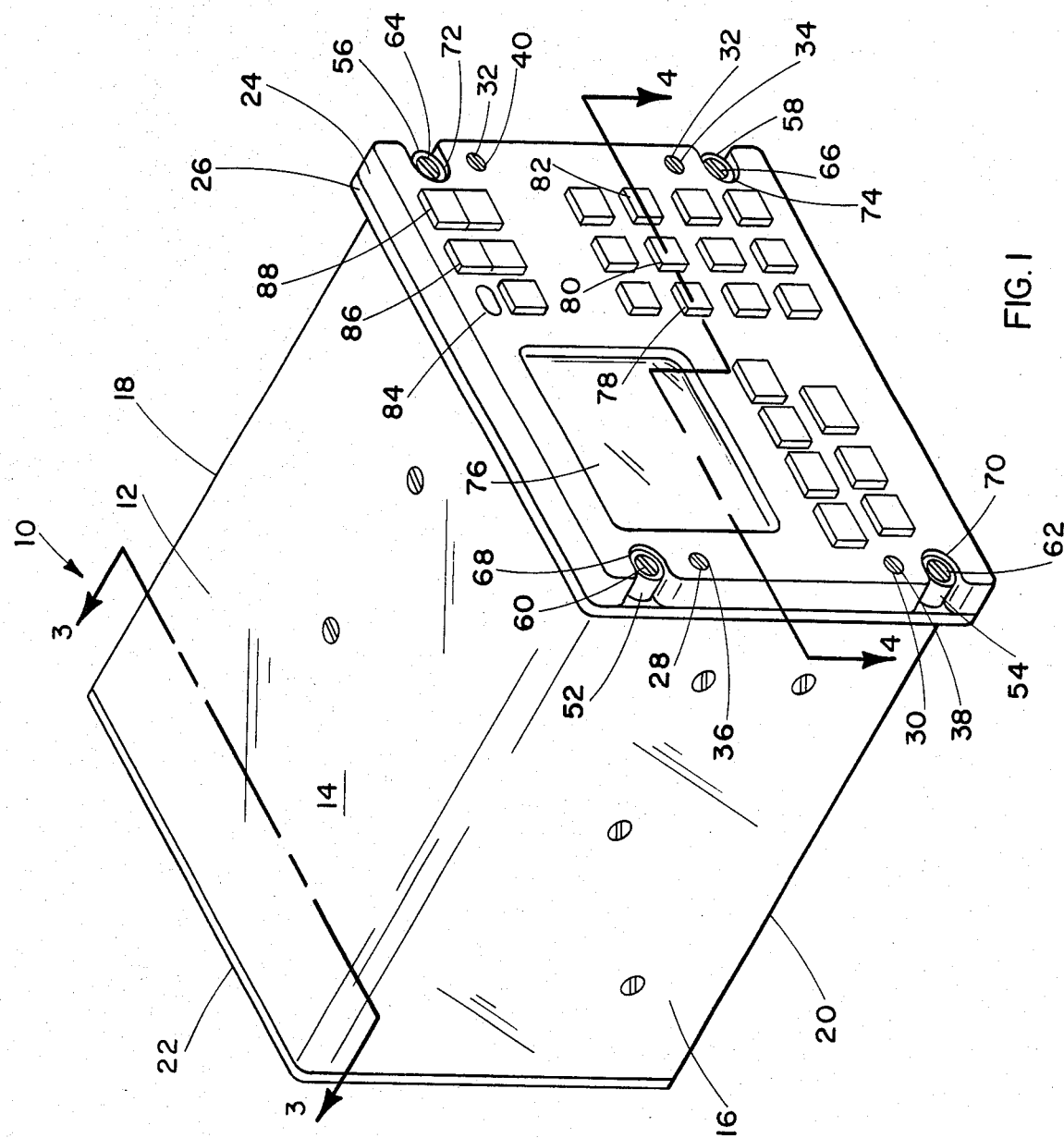
FIG. 1 is a perspective view of an aircraft navigational computer display assembly.

Illustrated in FIG. 1 of the drawings is the preferred embodiment of the invention. The aircraft navigation computer display assembly shown in FIG. 1 has particular utility for use in aircraft where cockpit panel space is at a premium and maintainability is important. The computer display assembly 10 includes a housing 12 having a rectangular cross-section with a top portion 14, a first side portion 16, a second side portion 18 and a bottom portion 20. The computer display assembly 10 also includes a rear panel 22 and a front panel 24 secured to each end of the housing 12. The housing 12 also includes a mounting flange 26 to which the front panel 24 is secured by means of fasteners 28, 30, 32 and 34. The fasteners 28, 30, 32 and 34, which are preferably screws, are inserted through apertures 36, 38, 40 and 42 in the front panel assembly 24 and engage threads in mounting holes 44, 46, 48 and 50 of the mounting flange 26 as shown in FIG. 2.

Also secured to the mounting flange 26 are four guide members 52, 54, 56 and 58 located at approximately each corner of the flange 26 and are attached to the flange by means of the fastening devices or screws 60, 62, 64 and 66. The guide members provide support and guide means for the front panel 24 by fitting within a set of grooves 68, 70, 72 and 74 configured in the front panel 24 when the front panel is mounted on the flange 26.

The front panel additionally includes a filter member 76 composed of a plastic sheet having a predetermined band transmittance. In order to enter data into the computer display and to control the functions of the computer display unit 10, the front panel 24 includes a number of data entry and function keys represented by a row of keys 78, 80 and 82. In addition, the front panel includes a message annunciator light 84 and a pair of rocker switches 86 and 88.

Figure 2:
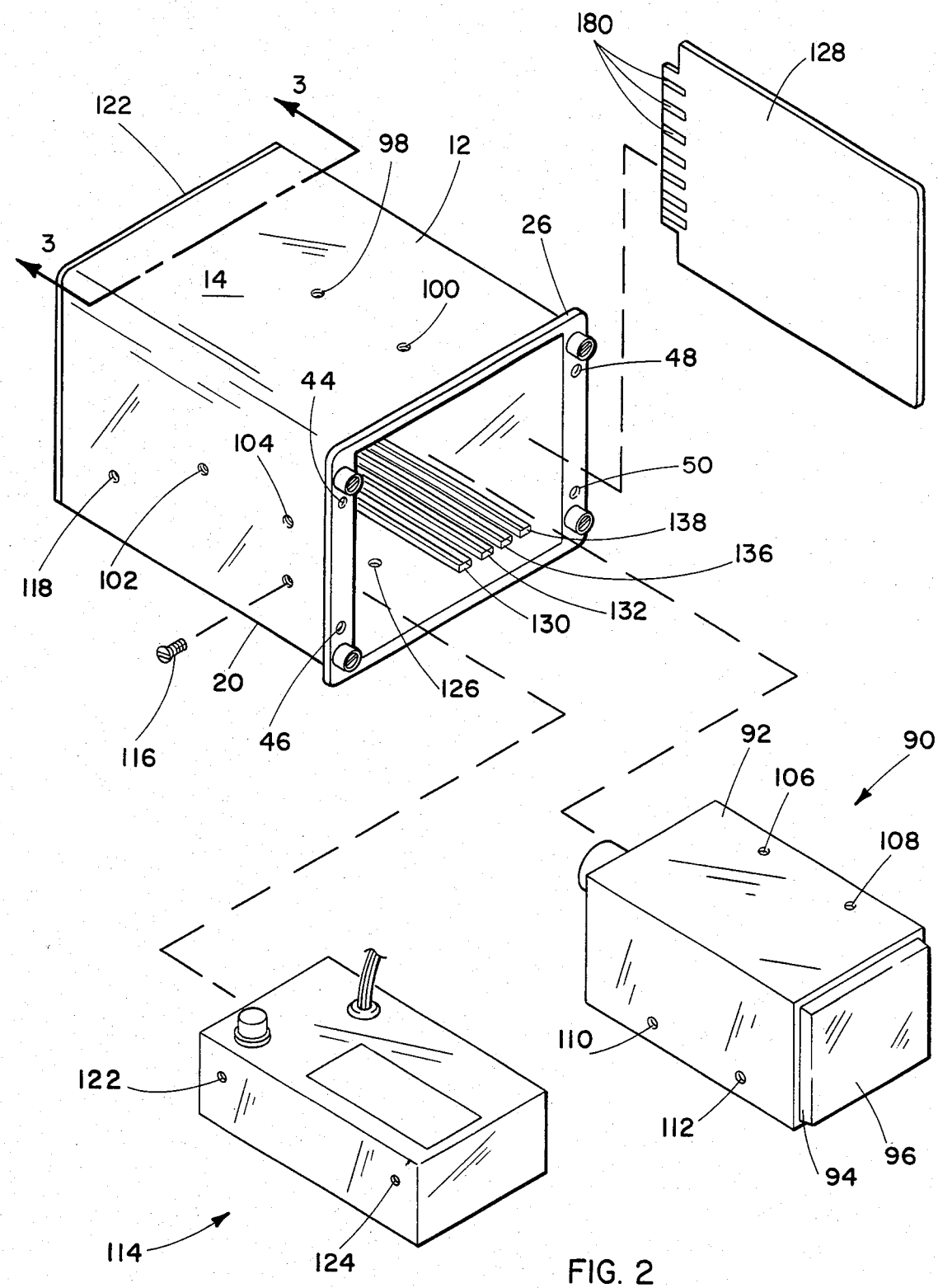
FIG. 2 is an exploded view of the interior of the aircraft navigation computer display assembly.

In FIG. 2 is provided an illustration of the internal components of the computer display assembly 10 of FIG. 1 without the front panel assembly 24. Secured in the upper left-hand corner or quadrant of the housing 12 is a cathode ray tube assembly as indicated at 90. The cathode ray tube assembly 90 includes, as will be explained in more detail with reference to FIGS. 5 and 6, a shield 92 and a CRT tube 94 having a display screen 96. The cathode ray tube assembly 90 is secured within the upper left-hand quadrant of the housing 12 by means of fasteners or screws 98, 100, 102 and 104 that are inserted through corresponding holes in the top 14 of the housing 12 and through holes in the side 16 of the housing 12. The foregoing fasteners 98, 100, 102 and 104 inserted through the housing 12 are engaged with a set of holes 106 and 108 in the top of the shield 92 and a set of holes 110 and 112 in the side of the shield 92.

In a similar manner, a power supply indicated generally at 114 is secured within the housing 12 in the lower left-hand corner or quadrant by means of fasteners or screws as represented for example by screws 118 and 120 inserted through a pair of corresponding holes 118 and 120 in the housing 12 and threadably secured in a pair of holes 122 and 124 in the power supply. An additional pair of fasteners in the bottom 20 of the housing 12, as represented by a hole 126, serves to secure the power supply 114 within the housing directly below the cathode ray tube assembly 90.

Electronic circuitry for the computer display assembly is provided on a number of circuit boards of a type indicated by the circuit board 128. For simplicity of illustration, only one circuit board 128 is shown in the drawing of FIG. 2 although in the preferred embodiment of the invention four circuit boards are used. Each circuit board is mounted and secured within the housing 12 by means of a pair of tracks for each circuit board. As shown in FIG. 2, there are four pairs or sets of tracks for mounting the circuit boards. The lower track of each pair is indicated in FIG. 2 by tracks 130, 132, 136 and 138 secured to the bottom portion 20 of the housing 12. A corresponding upper track (not shown) is secured to the upper portion 14 of the housing in alignment with the lower tracks 130, 132, 136 and 138 so that the printed circuit boards are mounted in a vertical position in the housing along side the cathode ray tube assembly 90 and the power supply 114. Use of the tracks as shown in FIG. 2 permits the circuit boards to slide in and out of the front of the housing.

It will be appreciated that the arrangement of the internal components of the computer display assembly 12 as shown in FIG. 2 permits the expeditious removal of the various internal components 90, 114 and 128 of the computer display unit with a minimum of effort and the circuit boards 128 can be removed without the necessity of removing the housing 12 from the aircraft.

Figure 3:
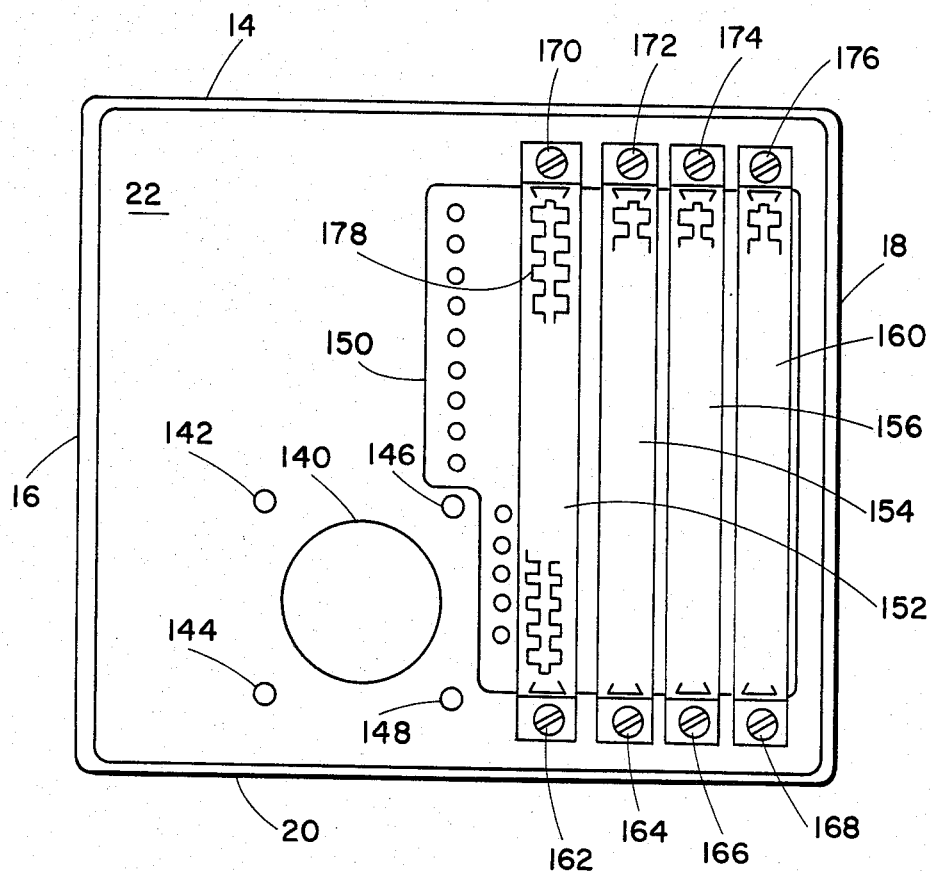
FIG. 3 is an interior view of the rear panel of the aircraft navigational display computer assembly taken along section lines 3—3 of FIG. 1.

In FIG. 3 is illustrated an interior view along section lines 3—3 of FIG. 2 of the rear panel 22 of the housing. Included in the rear panel is an electrical connector 140 secured by fasteners through a set of holes 142, 144, 146 and 148 to the rear panel 122. Also included in the rear panel is a terminal board 150 having attached thereto four recepticals 152, 154, 156 and 160 which are secured by means of fasteners 162-176 to the rear panel 22. A series of electrical contacts 178 indicated by the broken away lines on receptical 152 are provided to permit electrical contact between a series of electrical contactors shown by a series of contacts 180 on the circuit board 128 of FIG. 2 with the terminal blocks 152, 154, 156 and 160. Thus, a circuit board, such as 128, can be plugged into the computer display assembly by merely sliding it along one of the tracks 130, 132, 136 or 138 and plugging it into one of the recepticals 152, 154, 156 and 160 on the terminal board 150.

Figure 4:
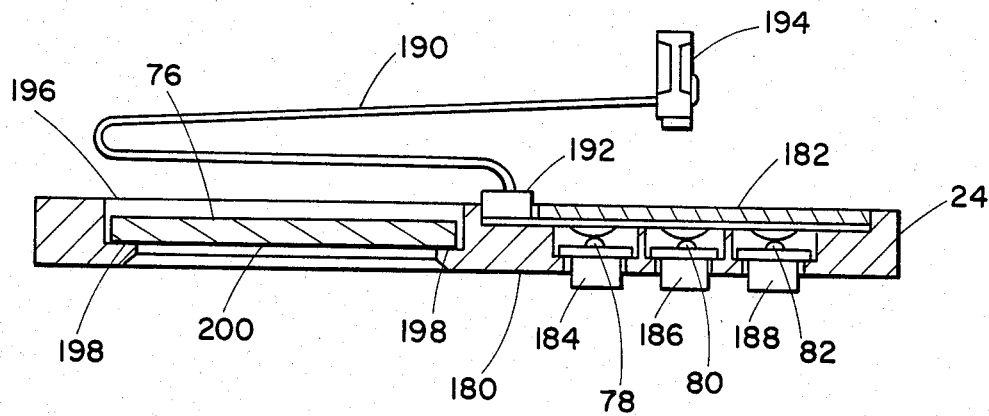
FIG. 4 is a sectioned view of the front panel of the aircraft navigation computer display assembly taken along section lines 4—4 of FIG. 1.

A cross-sectional view of the front panel 24 of the computer display assembly 10 is illustrated in FIG. 4. As shown in FIG. 4 the front panel member 24 is composed of a planar front member 180 and a planar rear member 182 secured to the front member 180 enclosing the switches 78, 80 and 82. The switches as illustrated in FIG. 4 are preferably snap-action push button switches having their push button portions 184, 186 and 188 extending through openings in the front member 180 of the front panel assembly 24. Electrically connected to the switches in the front panel assembly 24 is a flat cable 190 which can include, for example, sixteen or more wires in parallel. A connector block 192 is attached to the front panel 24 and a terminal connector 194 for connecting the switches and other electrical components of the front panel assembly to the various electrical components in the computer display assembly 10 is connected to the end of the cable 190. The front panel assembly 24 is also configured with a CRT aperture 196 which is in alignment with the display screen 96 of the CRT when the front panel assembly 24 is secured to the housing 12. In the embodiment shown in FIG. 4, the front member of the front panel assembly 24 is configured with a shoulder 198 on the inner portion of and extending around the aperture 196. The filter 76 is then secured, preferably by gluing, to the shoulder 198.

In the preferred embodiment of the invention, the filter 76 is configured out of a plastic material, such as the 3M Company's G5410, that has a narrow band transmittance characteristic that matches the emission band of the phosphor used in the CRT 94. The preferred phosphor used in the invention is the P43 phosphor as designated by the Joint Electron Device Engineering Council of the Electronic Industries Association. The filter will thus preferably have a corresponding band transmittance characteristic of 544.5 nm.

In order to eliminate reflections from the surface of the filter, a very light matte is applied to the front or viewing surface 200 of the filter. It is also considered desirable to apply an abrasion resistant coating to the front surface 200 of the filter in order to resist abrasion, maring, scratching and staining to which the filter 76 may be subject in aircraft usage.

In order to minimize glare and to produce a display from the CRT screen 96 with a minimum of distortion, it is preferable to dimension the various components of the front panel assembly 24 such that the filter 76 will be within 0.010 inch of the CRT display screen 96 when the front panel assembly 24 is secured to the housing 12.

By utilizing a filter 76 and CRT phosphor with the above-described characteristics and aligned with respect to the cathode ray tube 94 as described, a relatively inexpensive readable CRT display can be produced which is suitable for business-commercial aviation cockpits where ambient and direct sunlight levels are high.

Figure 5:
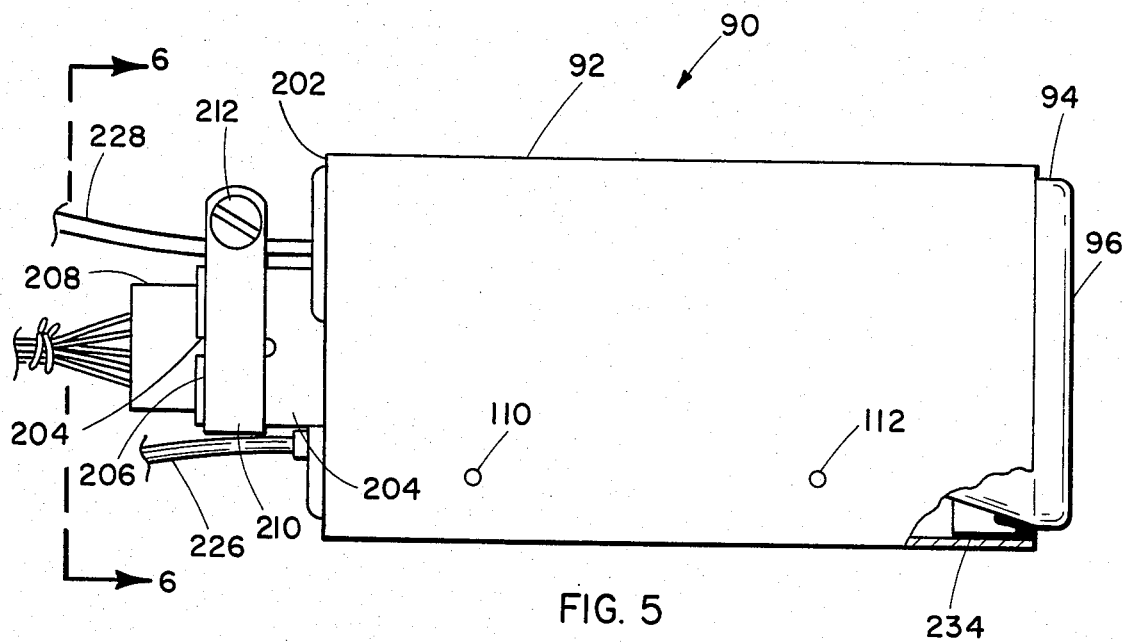
FIG. 5 is a side view of a cathode ray tube assembly used in the aircraft navigational computer display assembly.
Figure 6:
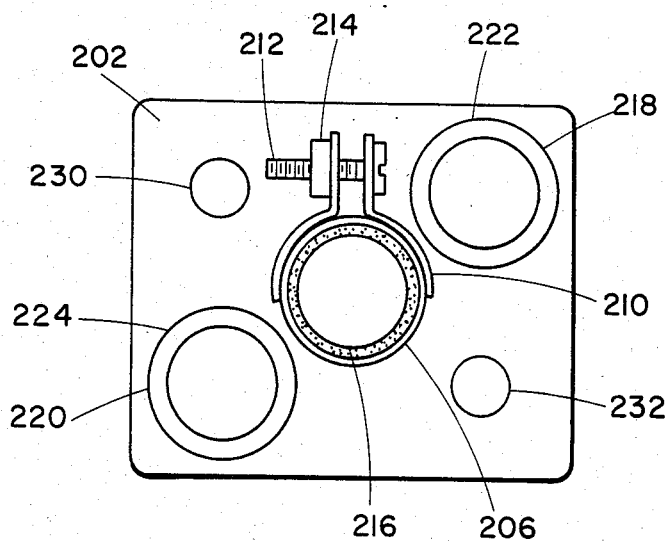
FIG. 6 is a rear view of the cathode ray tube assembly of FIG. 5 taken along section lines 6—6.

In FIGS. 5 and 6 is provided an illustration of the cathode ray tube assembly 90. The shield 92 completely encloses the cathode ray tube 94 and is preferably configured out of a high permeability metal. The rear portion 202 of the cathode ray tube assembly 90 includes a circular member 206 that is configured with a slot 204. The neck 208 of the CRT 94 extends through the circular member 204 and is secured by means of a band clamp 210 within the shield 92. As shown in FIGS. 5 and 6, the band clamp 210 includes a screw 212 and a nut 214. FIG. 6 is an illustration of the rear portion 202 of the cathode ray tube assembly without the cathode ray tube 94. Inserted into the circular member 206 is a sponge rubber tape 216 that serves to insulate the neck 208 of the CRT 94 from the circular member 206.

The rear portion 202 of the cathode ray tube assembly 90 also includes two apertures 218 and 220 with rubber grommets 222 and 224 that serve as openings for the cathode ray tube control cables shown by 226 and 228 in FIG. 5 to exit the shield assembly 90. An additional pair of apertures 230 and 232 are provided in the rear portion 202 of the shield structure 92 to allow for convection cooling and adjustment of the cathode ray tube 94.

In order to provide additional insulation from shock, the shield 92 is coated on its interior surface with an insulating material 234 such as a polycohr tape as shown in the broken away section of the shield 92 in FIG. 5.

We claim:

1. A navigation computer display assembly for aircraft comprising:
    a housing configured with a rectangular cross-section and having a first and a second side along with a top and a bottom;
    a cathode ray tube assembly, including a cathode ray tube having a display screen, located and secured in an upper quadrant of said housing;
    a power supply located and secured in a lower quadrant of said housing below said cathode ray tube assembly;
    a plurality of circuit boards vertically orientated and slidably secured within said housing and located on the side opposite to said cathode ray tube and said power supply;
    a rear panel, including a receptical assembly for receiving said circuit boards, secured to said housing;
    a front panel assembly including a plurality of switches and configured with a CRT aperture, removably secured to said housing with said aperture aligned with said cathode ray tube, thereby permitting said circuit boards to be removed from the front of said housing; and
    a shield configured out of high permeability metal enclosing said cathode ray tube and secured to said top of said housing and to said side of said housing effective to secure said cathode ray tube within said housing.

2. The cathode ray tube assembly of claim 1 wherein said shield includes a rear portion having an aperture for receiving the neck of said cathode ray tube and at least one cable aperture.

3. The cathode ray tube assembly of claim 2 wherein said rear portion includes a circular member concentric with said neck aperture and a band clamp effective to secure the cathode ray tube neck within said circular member.

4. The cathode ray tube assembly of claim 3 additionally including a sponge rubber material interposed between said circular member and said cathode ray tube neck.

5. The cathode ray tube assembly of claim 4 additionally including rubber grommets secured within said cable apertures.

6. The assembly of claim 1 wherein said housing includes a plurality of pairs of tracks where one track of each pair is secured to said top and the other is secured to said bottom and wherein each pair of tracks is adapted to receive one side of one of said circuit boards and to permit said circuit boards to slide out of the front of said housing.

7. The assembly of claim 6 wherein said receptical assembly includes a plurality of terminal blocks with each of said terminal blocks aligned with one of said pairs of tracks and wherein each of said terminal blocks includes electrical connectors adapted to receive electrical connectors on said circuit boards.

8. The assembly of claim 1 wherein said power supply is secured by means of a plurality of fasteners to said first side and to said bottom of said housing.

9. The assembly of claim 1 wherein said front panel assembly is substantially planar and rectangular in configuration and is configured with a shoulder portion located on each side of said CRT aperture and includes a planar filter member having a band transmittance corresponding to the emission band of the cathode ray tube for enhancing the visible light output of the cathode ray tube secured in front of said cathode ray tube to said shoulder.

10. The assembly of claim 9 wherein said filter member is configured with a matte surface located on the outer portion of said filter member.

11. The assembly of claim 9 wherein said front panel assembly is secured to said housing such that said filter member is spaced approximately 0.010 inch from said cathode ray tube display screen.

12. A navigation computer display assembly for aircraft comprising:
    a housing configured with a rectangular cross-section and having a first and a second side along with a top and a bottom;
    a cathode ray tube assembly including a cathode ray tube having a display screen and a shield configured out of a high permeability metal enclosing said cathode ray tube wherein said shield is secured to said first side and said top of said housing;
    a power supply secured to said first side and said bottom of said housing underneath said cathode ray tube;
    at least one pair of tracks wherein one of each of said pair of tracks is disposed to said top and the other is disposed to said bottom in alignment with each other;
    at least one circuit board, including electrical terminals, vertically orientated within said housing and wherein each circuit board is slidably engaged with a pair of said tracks;

a rear panel secured to said housing and including a receptical assembly for receiving said circuit board electrical terminals; and a generally planar front panel assembly including a plurality of switches and configured with a CRT aperture aligned with said cathode ray tube and further including a filter member having a band transmittance corresponding to the emission band of said cathode ray tube for enhancing the visible light output of said cathode ray tube secured in front of said cathode ray tube in close opposition to said cathode ray tube display screen and a plurality of fastening members securing said front panel to said housing wherein said front panel assembly is configured with a shoulder portion located on each side of said CRT aperture and said filter member is substantially planar and secured in front of said cathode ray tube to said shoulder portion.

13. The assembly of claim 12 wherein most of said switches are snap action push button switches enclosed within said front panel assembly.

14. The assembly of claim 13 wherein said shield includes a rear portion configured with a circular member concentric with the neck of said cathode ray tube, a sponge rubber material interposed between said circular member and said cathode ray tube neck, and a band clamp effective to secure said cathode ray tube neck within said circular member.

* * * * *